United States Patent
Benzel et al.

(10) Patent No.: US 7,306,966 B2
(45) Date of Patent: Dec. 11, 2007

(54) METHOD FOR PRODUCING A SEMICONDUCTOR COMPONENT AND A SEMICONDUCTOR COMPONENT, ESPECIALLY A MEMBRANE SENSOR

(75) Inventors: Hubert Benzel, Pliezhausen (DE); Heribert Weber, Nürtingen (DE); Hans Artmann, Magstadt (DE); Thorsten Pannek, Stuttgart (DE); Frank Schäfer, Tübingen (DE)

(73) Assignee: Robert Bosch GmbH, Stuttgart (DE)

( * ) Notice: Subject to any disclaimer, the term of this patent is extended or adjusted under 35 U.S.C. 154(b) by 343 days.

(21) Appl. No.: 10/486,182

(22) PCT Filed: Jul. 25, 2002

(86) PCT No.: PCT/DE02/02731

§ 371 (c)(1), (2), (4) Date: Aug. 20, 2004

(87) PCT Pub. No.: WO03/016203

PCT Pub. Date: Feb. 27, 2003

(65) Prior Publication Data

US 2004/0266050 A1    Dec. 30, 2004

(30) Foreign Application Priority Data

Aug. 7, 2001    (DE) ................. 101 38 759

(51) Int. Cl.
*H01L 21/00* (2006.01)
(52) U.S. Cl. ............. 438/53; 216/2; 257/E21.215
(58) Field of Classification Search ............. 438/53, 438/745; 216/2; 257/E21.215
See application file for complete search history.

(56) References Cited

U.S. PATENT DOCUMENTS

| | | | | |
|---|---|---|---|---|
| 5,352,635 A * | 10/1994 | Tu et al. | ............ | 438/53 |
| 6,165,835 A * | 12/2000 | Wendt et al. | ............ | 438/242 |
| 6,359,276 B1 | 3/2002 | Tu | | |
| 6,746,932 B2 * | 6/2004 | Pannek | ............ | 438/409 |
| 6,759,265 B2 * | 7/2004 | Artmann et al. | ............ | 438/53 |
| 6,766,817 B2 | 7/2004 | da Silva | | |
| 6,972,447 B2 * | 12/2005 | Benzel et al. | ............ | 257/254 |
| 7,037,438 B2 * | 5/2006 | Benzel et al. | ............ | 216/2 |
| 2004/0237529 A1 | 12/2004 | da Silva | | |

FOREIGN PATENT DOCUMENTS

| | | |
|---|---|---|
| CN | 1 251 945 | 5/2000 |
| DE | 197 54 513 | 6/1999 |
| DE | 100 32 579 | 1/2002 |

OTHER PUBLICATIONS

Database WPI Section EI, Week 200038, Derwent Publications Ltd., London, GB, May 3, 2000.

* cited by examiner

*Primary Examiner*—Savitri Mulpuri
(74) *Attorney, Agent, or Firm*—Kenyon & Kenyon LLP

(57) ABSTRACT

In a method for manufacturing a semiconductor component having a semiconductor substrate, a flat, porous diaphragm layer and a cavity underneath the porous diaphragm layer are produced to form unsupported structures for a component. In a first approach, the semiconductor substrate may receive a doping in the diaphragm region that is different from that of the cavity. This permits different pore sizes and/or porosities to be produced, which is used in producing the cavity for improved etching gas transport. Also, mesopores may be produced in the diaphragm region and nanopores may be produced as an auxiliary structure in what is to become the cavity region.

7 Claims, 4 Drawing Sheets

METHOD FOR PRODUCING A SEMICONDUCTOR COMPONENT AND A SEMICONDUCTOR COMPONENT, ESPECIALLY A MEMBRANE SENSOR

FIELD OF THE INVENTION

The present invention relates to a method for manufacturing a semiconductor component.

BACKGROUND INFORMATION

Semiconductor components, in particular diaphragm sensors, and methods for manufacturing diaphragm sensors on the basis of a semiconductor substrate, e.g., a silicon wafer, on which a flat, porous diaphragm region is situated as a support layer for sensor structures and which has a cavity under the diaphragm region for in particular thermal insulation of the diaphragm, are already known.

Most diaphragm sensors presently existing in the market are usually implemented as thin-film diaphragm sensors. For this purpose, layer systems are deposited on a substrate in thicknesses between a few tens of a nm and a few µm, and subsequently the substrate is removed in predefined regions to obtain unsupported diaphragm regions. Sensor structure elements can then be placed in the center of the diaphragm.

Another option for exposing the diaphragm is by use of surface micromechanics (SMM), in which a sacrificial layer is normally used, which is applied to the front of a carrier substrate before depositing the diaphragm. The sacrificial layer is later removed from the front of the sensor through "dissolution openings" in the diaphragm, whereby an unsupported structure is obtained. These surface micromechanical methods are relatively complicated due to the need for separate sacrificial layers.

German Patent Application No. DE 100 325 79.3 describes a method for manufacturing a semiconductor component and a semiconductor component manufactured by this method, in which a layer of porous semiconductor material is placed over a cavity for a diaphragm sensor in particular.

Using these measures, it is possible to considerably simplify the design of an SMM semiconductor component, because no sacrificial layer needs to be additionally applied, and the diaphragm itself or a substantial part thereof is produced from semiconductor material.

However, tests have shown that a porous diaphragm may be damaged as early as during manufacturing, and even under conventional conditions of use damage cannot always be reliably prevented.

SUMMARY

An object of the present invention is to prevent damage to the diaphragm during manufacture or under normal conditions of use.

The present invention is generally directed to a method for manufacturing a semiconductor component, a diaphragm sensor having a semiconductor substrate in particular, in which a porous diaphragm layer and a cavity underneath the porous diaphragm layer are produced to form unsupported structures for the component. In accordance with the present invention, in the region of the porous diaphragm layer the semiconductor substrate has a doping that is different from that of the region of what is to become the cavity, the semiconductor material of the diaphragm layer is made porous, and the semiconductor material underneath the porous semiconductor material is removed or partially removed and rearranged to form a cavity. This procedure may have the advantage that the properties of the porous diaphragm layer and the production of the cavity may be tuned to one another in such a way that, for example, when the cavity is etched, the gas thus generated is able to escape unhindered through the porous diaphragm layer, or an auxiliary structure having an appropriate pore size which is different from the pore size in the diaphragm layer is initially created in the region of the cavity, always with the objective to prevent damage to the porous diaphragm layer at the time the cavity is produced.

This precursor or auxiliary structure may then be removed or, for example, rearranged in a high-temperature process in a further step.

In a further preferred embodiment of the present invention, in the region of the porous diaphragm layer, the semiconductor material substrate receives doping which varies in the lateral and/or vertical direction. Different types and degrees of doping result in pores of different sizes and/or different types when porous semiconductors, for example, porous silicon, are manufactured, where an electrochemical reaction between hydrofluoric acid and silicon, with the silicon semiconductor substrate (e.g., silicon wafer) functioning as an anode with respect to a hydrofluoric acid electrolyte and the semiconductor substrate being additionally illuminated (for n-doped semiconductor regions), is normally used. Thus, according to the present invention, larger pores and/or pores with a higher degree of porosity are produced in the lateral and/or vertical direction in certain diaphragm regions, the gas produced in etching the cavity being able to escape more easily through these pores. In this way, damage to the sensitive porous diaphragm layer by bubble formation during etching of the cavity is prevented. In conventional porous diaphragm structures the pores are often unable to ensure controlled, sufficient escape of the gas from the cavity during etching, which in the worst case may ultimately result in damage to the diaphragm.

In a particularly preferred embodiment of the present invention, the doping of the semiconductor material for the edge region and central region of the diaphragm is selected in such a way that mesopores (pores on the order of 5 nm to 50 nm) are formed in the edge region and macropores (pores greater than 50 nm and up to a few µm) or mesopores or nanopores having a higher porosity compared to the edge region are formed in the central region of the diaphragm. In the edge region of the diaphragm having a lower porosity, a good layer quality is possible, for example, for a subsequent epitaxial process, while in the central region of the diaphragm the epitaxial quality is comparatively lower due to higher-porosity sections. In many applications, as an SMM pressure sensor, for example, this is, however, unimportant, because the properties of the pressure sensor are not impaired thereby.

For example, the central region of the diaphragm obtained from a silicon wafer receives an n-type doping to produce macropores, while the edge region of the diaphragm is provided with p$^+$ doping to obtain mesoporous silicon.

In a further, particularly advantageous embodiment of the present invention, the semiconductor substrate is doped differently in the region of the diaphragm layer and in the region of what is to become the cavity in such a way that mesopores may be produced in the semiconductor material of the diaphragm layer and nanopores (pores from 2 nm to 5 nm) having a comparatively higher porosity may be produced as a "precursor structure" in the cavity region, and in a further step the nanoporous precursor structure is removed. The production of a small-pore precursor structure prevents the formation of comparatively large air bubbles, which makes it possible to adequately remove the gas bubbles through the porous diaphragm layer. In this procedure, use is made of the fact that the "nanostructure" has a considerably higher internal surface area than the "mesostructure" of the diaphragm region, which is usable in a subsequent process step for a shorter oxidation time. This makes it possible to subsequently produce a completely oxidized nanostructure which is then selectively removable in a subsequent etching process, e.g., in a vapor etching process. A vapor etching process, in particular, additionally suppresses problems at the time of drying the diaphragm such as adhesion of the porous layer to the substrate bottom due to vertical capillary forces which frequently occurs at the time of drying the possibly porous silicon diaphragm, which may make the porous diaphragm layer unusable. The cavity may also be produced by rearranging the nanoporous layer in a high-temperature process. The mesopores of the porous diaphragm layer may be achieved, for example, from a $p^+$-type doping in a silicon wafer (specific resistivity approximately 0.02 $\Omega$cm) at a porosity of approximately 10% to 30%, a layer thickness of 0.1 μm to 10 μm or more, using, for example, a current density of approximately 1 to 20 mA/cm² in a relatively concentrated hydrofluoric acid having an HF concentration of approximately 30% to 40%. The nanoporous precursor structure is preferably produced on the basis of a p-doped layer (specific resistivity 1 $\Omega$cm to 10 $\Omega$cm) in an HF concentration of approximately 15% to 40% and at a current density of 10 to 80 mA/cm². Using these parameters, a porosity of over 80% may be achieved over a layer thickness of 1 μm to 10 μm.

An alternative procedure in forming the cavity structure may also involve directly dissolving the semiconductor material underneath the porous layer using electrolytic polishing, for example, at comparatively higher current densities and lower HF concentrations. For a silicon wafer this may be achieved, for example, by $p^+$-doping a starting layer to form the porous layer over the cavity and the region of what is to become the cavity receiving only a p-type doping. For example, the starting layer to form the porous layer over the cavity has a $p^+$-type doping and a specific resistivity of approximately 0.02 $\Omega$cm. At an HF concentration of 30% to 40%, for example, and a current density of approximately 1 to 20 mA/m², a porosity of 10% to 30% may be achieved. The layer thickness of the porous layer may be 1 μm to 10 μm or even more.

In a further exemplary embodiment, in which the diaphragm region is doped differently from what is to become the cavity region, the starting layer receives an n-type doping having a specific resistivity of 0.1 $\Omega$cm to 10 $\Omega$cm, for example, to form the porous layer over the cavity. At a current density of 5 mA/cm² and a relatively low HF concentration of 2% to 10%, macropores are preferably formed over a layer thickness of 1 μm to 10 μm, for example. The macropores have the advantage that gases may escape through them more easily as the cavity is produced, which counteracts the porous layer being affected or even destroyed.

The cavity region is p-doped, for example, so that a specific resistivity of 1 $\Omega$cm to 10 $\Omega$cm is obtained. For this case, the cavity layer may be produced directly by electrolytic polishing at an HF concentration of 2% to 10% and a current density of preferably greater than 50 mA/cm². The cavity may, however, also be produced via a "precursor structure" by producing nanopores. The "nanostructure" is obtained, for example, at an HF concentration of 15% to 40%, a current density of 2 to 50 mA/cm², and preferably has a porosity greater than 80%.

The layer thicknesses of the porous layer over the cavity and the cavity layer may be 1 μm to 10 μm or more, depending on the desired application.

Instead of the p-type doping for the cavity layer, it may also have $p^+$- or $p^-$-type doping, whereby electrolytic polishing may be performed to immediately produce the cavity preferably at an HF concentration of 2% to 10% and a current density of greater than 50 mA/cm². Also in this case a "precursor structure" and additional processes may result in the desired cavity.

The advantages of a diaphragm containing macropores may also be achieved in an embodiment in which both the diaphragm layer and what is to become the cavity region have the same doping, for example, an n-type doping, but etching parameters other than those for the porous diaphragm are used for treating what is to become the cavity region, so that the cavity underneath the diaphragm region may be produced directly by electrolytic polishing. For example, a starting layer for the diaphragm layer is n-doped, so that a specific resistivity of 0.1 $\Omega$cm to 10 $\Omega$cm is obtained. What is to become the cavity region is doped in the same way. Subsequently macropores are produced in the starting layer over a layer thickness of 1 μm to 10 μm or more at a current density >5 mA/cm², for example, and an HF concentration of 5% to 10%, for example, with substrate backlighting.

The cavity layer is then directly produced by electrolytic polishing, which is possible using a current density that is greater than the current density for producing the porous cover layer.

For better control and adjustment of the current density in etching the semiconductor substrate for producing the porous diaphragm layer over the cavity or for better adjustment of the current density in etching the semiconductor material substrate during an electrolytic polishing process for directly producing the cavity or for producing a porous layer in the region of what is to become the cavity as a "precursor structure," the back of the semiconductor substrate, for example, the back of a silicon wafer is preferably illuminated.

It is also possible to produce the porous layer over the cavity using the same doping over both regions, for example, a $p^+$-type doping having a specific resistivity of 0.02 $\Omega$cm. For the starting layer, i.e., the porous diaphragm layer over the cavity, the aim is a porosity of 10% to 30% at a comparatively high HF concentration of 30% to 40% and a current density of 1 to 20 mA/cm², for example. Subsequently the cavity region may be produced directly by electrolytic polishing, for example, at an HF concentration of 2% to 10% and a current density greater than 50 mA/cm², for example, or via a precursor structure to be removed later. To form the precursor structure for $p^+$-type doping, an HF concentration of 5% to 20%, a current density of 2 to 50 mA/cm² is selected, for example, to achieve a porosity greater than 80%.

It is, however, also possible to set the HF concentration relatively high, as for producing the starting layer, which however, in order to achieve a high porosity of 80%, requires a current density that is higher than the current density for producing the starting layer.

Both the starting layer (porous diaphragm layer) and the cavity layer may have a thickness of 0.1 μm to 10 μm or greater, as according to specification.

For all the above-named processes, n-doped silicon may be used as masking for defining the diaphragm region for the case of a silicon wafer. Such a masking layer is also easily attacked when manufacturing porous silicon; therefore, it may be produced via an insulating layer, for example, of silicon nitride ($Si_3N_4$), in a low-pressure chemical vapor deposition (LPCVD) process, thereby protecting the n-doped masking layer against electrochemical attack. An undamaged n-doped masking layer is advantageous when an epitaxial layer is to be grown on it in a subsequent process. In the case of the use of the structure as a diaphragm sensor, however, an attack of the n-doped masking regions may often be tolerated.

Instead of the silicon nitride layer, other layers may also be used as protective layers, for example, a conductive metal layer of chromium/gold of an appropriate thickness.

The depth homogeneity of the laterally adjacent regions may also be improved by additional masking, which is of considerable advantage when producing macropores in particular.

Furthermore, the present invention is directed to a semiconductor component, a diaphragm sensor in particular, having a substrate made of semiconductor material, which has a diaphragm and a cavity located underneath the diaphragm for forming semiconductor component structures, the diaphragm including a layer of porous and optionally post-treated, for example oxidized, semiconductor material. An aspect of the present invention is that the degree of porosity of the layer deliberately varies in the lateral and/or vertical direction. This makes it possible, as described above for the gases produced in etching to escape more easily through regions of the porous layer, which have a comparatively higher porosity, when producing the cavity, in particular in the case of a difference in porosities in the lateral direction.

The porosity of the layer in the edge region of the diaphragm is preferably lower than in the central region of the diaphragm. This favors the escape of gas in the center of the diaphragm.

It is possible to regulate the escape of gas not only via the degree of porosity, but also via the pore size. The gas permeability of the porous layer is increased for the same porosity but larger pores.

To favor improved gas permeability in the center of the diaphragm region, the pore size in that area is greater than in the edge region of the diaphragm.

The porous layer is advantageously mesoporous in the diaphragm edge region and macroporous in the central region.

In accordance with an embodiment of the present invention, the diaphragm layer made of porous material has macropores throughout. The pores having larger dimensions improve the possibility of gas transport as a cavity is produced. For example, the diaphragm region and the region to become the cavity is made of, for example, n-doped silicon. The porous layer of the diaphragm region is produced, for example, using a current density greater than 5 $mA/cm^2$ in a comparatively low hydrofluoric acid concentration of 2% to 10% to form macropores. To produce the cavity, the current density is then increased, which results in an increase in the pore size and thus erosion of the starting layer forming the porous diaphragm layer. The result is a cavity which is covered by a macroporous layer (pores in the range of 100 nm to a few μm).

Furthermore, according to the present invention, a semiconductor component has one or more regions of non-porous semiconductor material, whose thickness is greater than the thickness of the porous layer, are located within the porous layer over the cavity. Using this measure, several advantages are achieved. First, adhesion of the porous diaphragm layer to the cavity bottom due to capillary forces during the process of manufacturing the porous diaphragm layer may be prevented. In the case of an application, for example, as a pressure sensor, such a design creates an overload protection. Not only is the adhesion of the layer to the cavity bottom then prevented, but also the deformation of the porous layer due to contact with the cavity bottom and any break-off of material from the porous layer. The broken-off material could block the deflection of the diaphragm. In addition, the non-porous regions may have a kind of stabilizing effect on the porous layer, in particular when the cavity is being produced, in particular when the non-porous regions form a grid in the porous layer. Such a design also increases the mechanical stability of the porous layer for subsequent process steps such as an epitaxy step.

In a preferred embodiment of the present invention, the regions have an insular design, i.e., with no connection to the edge of the diaphragm. For example, the non-porous regions include an annular structure. Such a structure also reduces the risk of diaphragm rupture in the region of attachment during use, for example, in the event of overload in that, if it is appropriately spaced from the diaphragm edge, the annular structure is supported on the cavity bottom and alleviates the load on the diaphragm in the area where it is attached.

Damage to the diaphragm when the cavity is being produced may also be counteracted if the edge region in the porous diaphragm layer includes a non-porous region of semiconductor material, which preferably completely surrounds the diaphragm layer and which, by using appropriate doping, is used as a masking layer in the manufacture of the porous semiconductor material, i.e., when forming the cavity, and has a thickness that is greater than the thickness of the porous diaphragm layer, including the depth of the cavity. Using these measures, excellent process control is achieved, in particular in forming the cavity, whose lateral dimension changes little over its depth. This also helps prevent damage to the porous diaphragm layer, since uncontrolled etching in the lateral direction is prevented.

DETAILED DESCRIPTION OF EXAMPLE EMBODIMENTS

Figure 1:
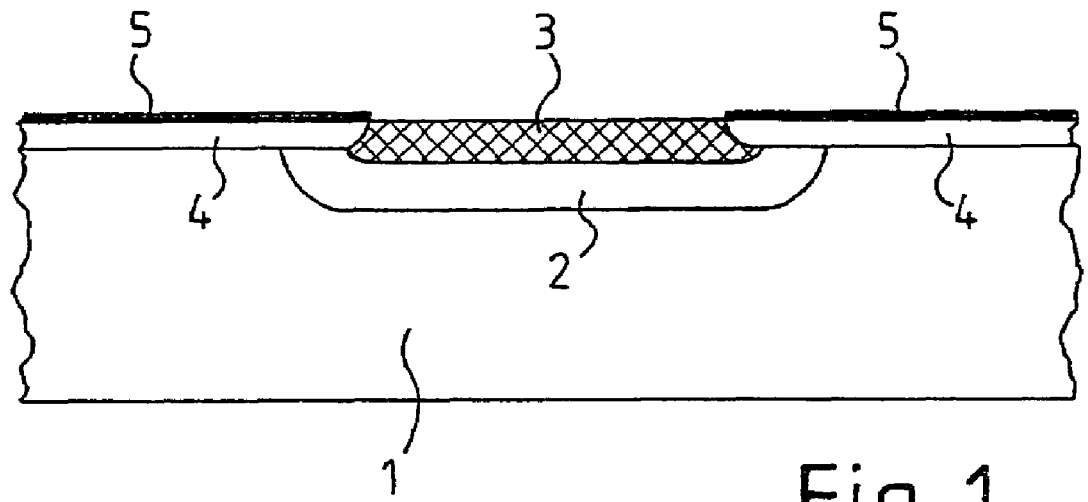
FIG. 1 shows a schematic section of a silicon substrate having an SMM diaphragm.

FIG. 1 shows a schematic section of a silicon substrate 1, in which a cavity 2 is formed. A porous diaphragm layer 3, delimited laterally by a masking layer 4, is situated over the cavity. FIG. 1 also shows an additional optional masking layer 5 which is situated on masking layer 4, protecting it. A metal plating or an insulator may also be used as an optional masking layer.

Depending on the process, diaphragm layer 3 may be manufactured of n-doped or p-doped silicon. Cavity 2 is preferably formed on the basis of silicon having a different p-type doping. Bulk silicon or silicon having a different p-type doping may be used as a silicon substrate material. n-doped silicon is preferably used for a masking layer 4 which delimits porous diaphragm layer 3.

Figure 2:
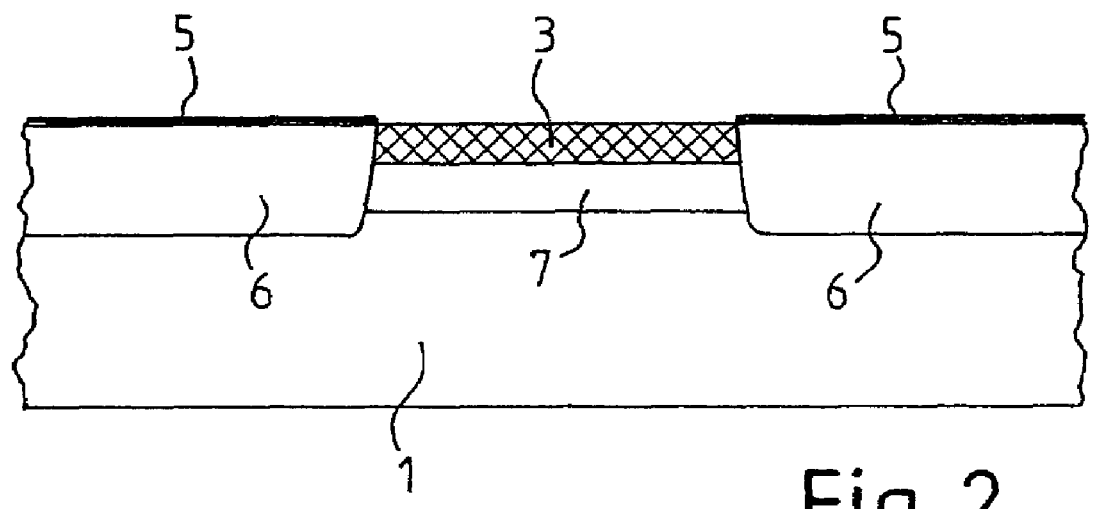
FIG. 2 shows another embodiment of an SMM diaphragm structure.

The structure according to FIG. 2 differs from that of FIG. 1 by the fact that an n-doped masking layer 6, which extends in depth over the thickness of diaphragm layer 3 and over cavity 7, is formed in the silicon substrate material. This only modifies insignificantly the etching surface over the depth when the cavity is produced, which considerably simplifies the process control during manufacture.

Figure 3A:
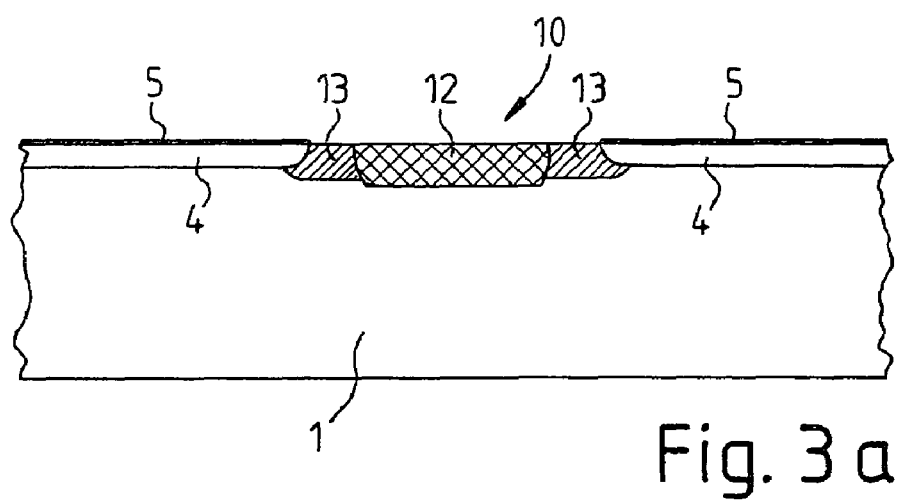
FIGS. 3a and 3b show schematic sections corresponding to FIGS. 1 and 2, which illustrate the etching of a cavity underneath a porous layer to produce an unsupported SMM diaphragm.
Figure 3B:
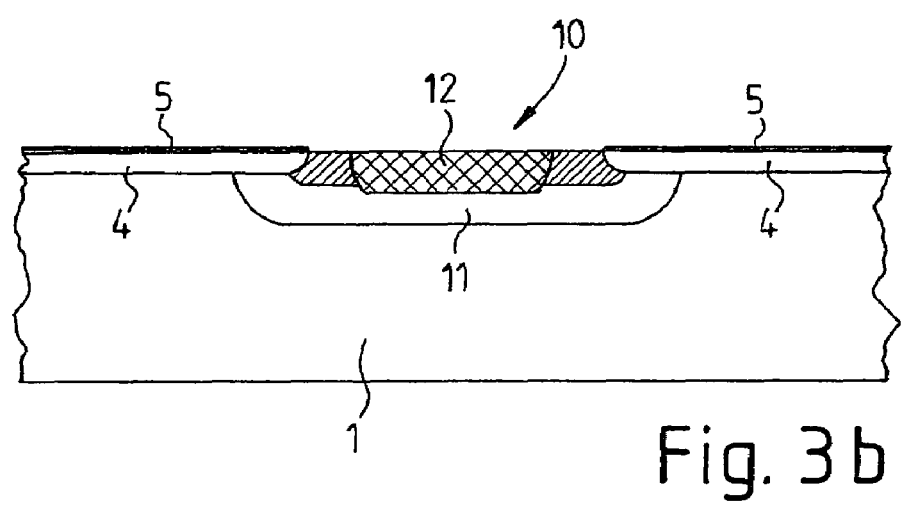

FIGS. 3a and 3b show the formation of a diaphragm layer 10 together with cavity 11 underneath it for the case where the semiconductor material has different doping regions in the lateral direction when porous diaphragm layer 10 is produced. When porous silicon is produced, this results in larger pores being produced in central region 12 of the diaphragm in the present example than in edge region 13 of the diaphragm. In addition, the porosity of layer 10 is lower in the edge region of the diaphragm due to appropriate process control, which makes it possible to grow a proper epitaxial enveloping layer when an SMM pressure sensor is manufactured, for example, in a further process step.

FIG. 3a shows the condition when diaphragm layer 10 having a different porosity has just been produced together with suitable masking 4, 5. During the subsequent production of cavity 11, as shown in FIG. 3b, the macroporous structure of the center of the diaphragm favors good permeability for the gas formed when etching the cavity. This prevents accumulation of gas underneath the diaphragm, which could be destroyed as early as during the production of cavity 11. Microporosity of porous diaphragm layer 10, which is needed for good epitaxial growth in the edge region, is still ensured.

Figure 4:
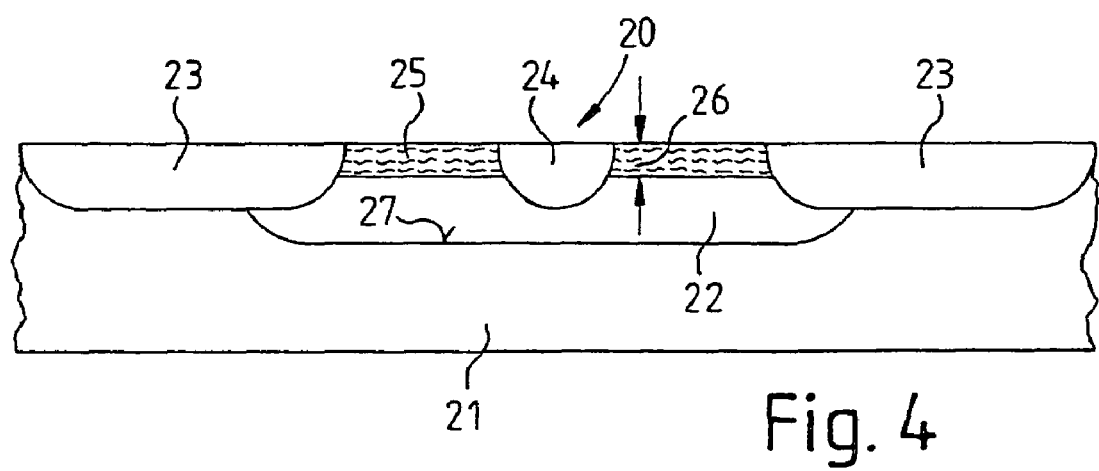
FIG. 4 shows a section corresponding to the preceding figures of a further embodiment of an SMM diaphragm structure.

FIG. 4 shows one embodiment of an SMM diaphragm 20, which is formed in a silicon substrate 21 over a cavity 22; unlike the diaphragm layers described previously, this diaphragm has a non-porous region 24 within a porous region 25 in the center. This non-porous region 24 corresponds to n-doped masking regions 23 for the lateral delimitation of the porous diaphragm and it is higher in the perpendicular direction to its lateral extension than thickness 26 of porous region 25.

As a result, when diaphragm 20 is deflected, its porous regions 24, which are very sensitive, never touch bottom 27 of cavity 22.

Non-porous region 24 represents a stop which comes to rest on cavity bottom 27 in the event of overload, limiting the deflection.

Figure 5A:
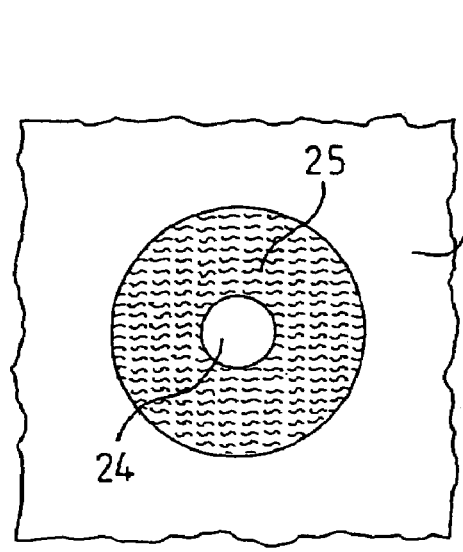
FIGS. 5a to 5d show four embodiments of an SMM diaphragm structure in a schematic top view.

FIG. 5a is a schematic top view of a diaphragm 20 of such a design.

Figure 5B:
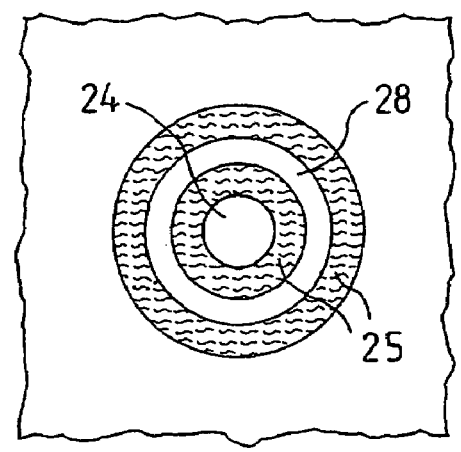

FIG. 5b differs from FIG. 5a by the fact that, in addition to non-porous region 24 directly in the center of the diaphragm, an additional non-porous annular region 28 is formed concentrically to the center of otherwise round porous regions 25.

Figure 6:
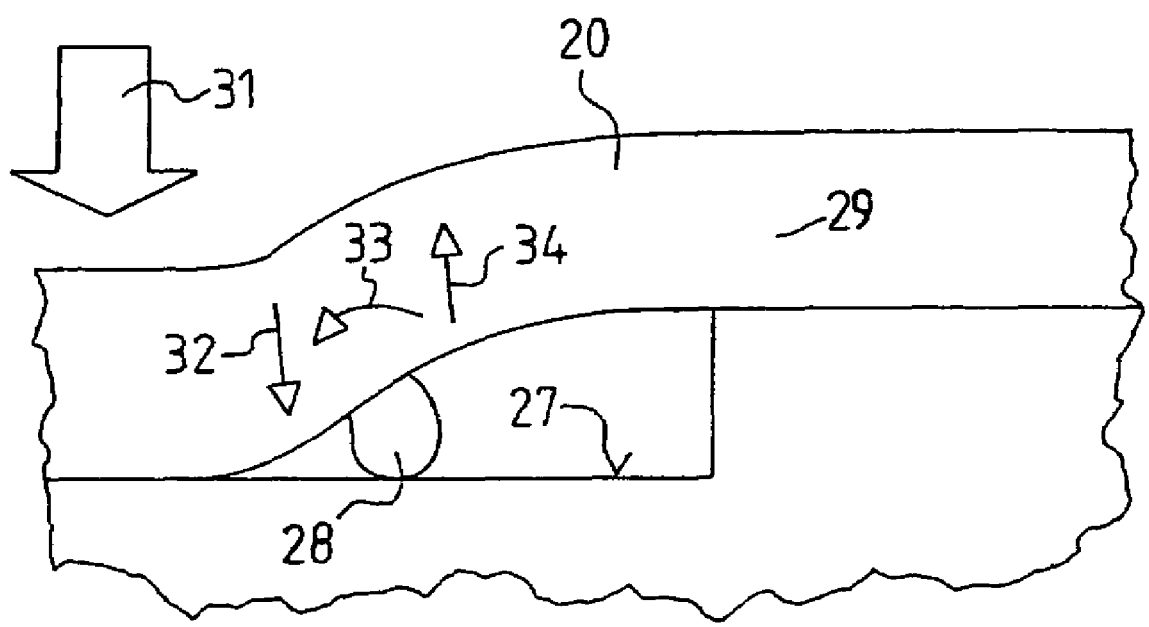
FIG. 6 shows a schematic section of some sections of an SMM diaphragm structure, illustrating the operation of an additional support structure.

The advantage of such an annular structure 28 is illustrated in FIG. 6 by a schematic section and arrows 31 through 35. When exposed to pressure, which means an overload for porous diaphragm 20 and which is symbolized by large arrow 31, diaphragm 20 is pressed toward cavity bottom 27, which may result in rupture of diaphragm 20 in region 29 of attachment. However, due to annular structure 28, the force is deflected (see arrow 33) in such a way that the load on the diaphragm is alleviated upward in the region of attachment (see arrow 34), although there is a force acting downward (arrow 32). All in all, stress rupture of diaphragm 20 in region of attachment 29 is prevented.

Figure 5C:
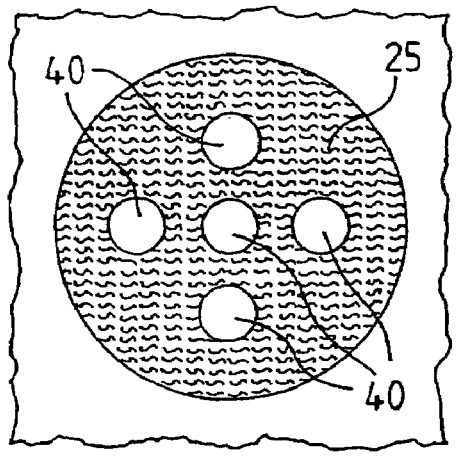
Figure 5D:
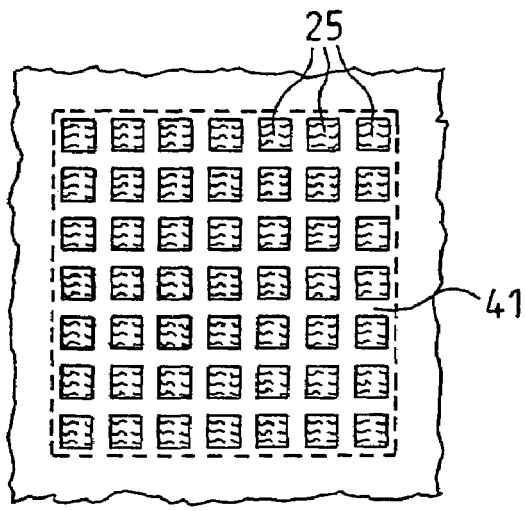

Other options of forming non-porous regions 40, 41 within porous region 35 are illustrated in the top views of FIGS. 5c and 5d. In particular, a grid structure 41, as shown in FIG. 5d, considerably increases the stability of the porous diaphragm both during manufacturing and in use.

What is claimed is:

1. A method for manufacturing a diaphragm sensor having a semiconductor substrate in which a porous diaphragm layer and a cavity underneath the porous diaphragm layer are produced to form an unsupported structure, the method comprising:
   doping the semiconductor substrate in a region of the diaphragm layer, the region of the diaphragm layer receiving doping that is different from that of a region of what is to become the cavity;
   processing semiconductor material of the region of the diaphragm layer so that it becomes porous; and
   removing or partially removing and rearranging semiconductor material underneath the porous semiconductor material to form the cavity;
   wherein the doping of the semiconductor material for an edge region and a central region of the porous diaphragm layer is selected in such a way that mesopores are formed in the edge region and one of macropores or mesopores, having a higher porosity compared to the edge region, are formed in the central region.

2. The method as recited in claim 1, wherein, in the region of the porous diaphragm layer, the semiconductor substrate receives doping which varies in at least one of a lateral and vertical direction.

3. The method as recited in claim 1, wherein the semiconductor substrate receives different dopings in the region of the porous diaphragm layer and in the region of what is to become the cavity in such a way that mesopores are produced in the region of the porous diaphragm layer and nanopores having a comparatively higher porosity are produced in the region of what is to become the cavity, and wherein the method further comprises:
   removing or partially removing and rearranging the region having the nanopores.

4. The method as recited in claim 3, wherein the region having the nanopores is first oxidized and subsequently the oxidized region is removed by etching.

5. The method as recited in claim 1, wherein the processing step includes etching the semiconductor material of the region of the diaphragm layer and etching the region that is to become the cavity, and wherein a porosity of approximately 10% to 30% is produced in the semiconductor material in the diaphragm region and a porosity greater than 80% in the region that is to become the cavity region by at least use of adjusting a current density and modifying an etching medium.

6. A method for manufacturing a diaphragm sensor having a semiconductor substrate in which a porous diaphragm layer and a cavity underneath the porous diaphragm layer are produced to form an unsupported structure, the method comprising:
   doping the semiconductor substrate in a region of the diaphragm layer, the region of the diaphragm layer receiving doping that is different from that of a region of what is to become the cavity;

processing semiconductor material of the region of the diaphragm layer so that it becomes porous; and removing or partially removing and rearranging semiconductor material underneath the porous semiconductor material to form the cavity;

wherein macropores or mesopores are produced in the region of the diaphragm layer, and the cavity is formed by electrolytic polishing underneath the region of the diaphragm layer, wherein the doping of the semiconductor material for an edge region and a central region of the porous diaphragm layer is selected so that mesopores are formed in the edge region and one of macropores or mesopores, having a higher porosity compared to the edge region, are formed in the central region.

7. A method for manufacturing a diaphragm sensor having a semiconductor substrate in which a porous diaphragm layer and a cavity underneath the porous diaphragm layer are produced to form an unsupported structure, the method comprising:

doping the semiconductor substrate in a region of the diaphragm layer, the region of the diaphragm layer receiving doping that is different from that of a region of what is to become the cavity;

processing semiconductor material of the region of the diaphragm layer so that it becomes porous; and removing or partially removing and rearranging semiconductor material underneath the porous semiconductor material to form the cavity, wherein the processing step includes etching the semiconductor material in the region of the diaphragm layer, and the remaining step includes etching the semiconductor material in the region underneath the porous semiconductor material during electrolytic polishing to produce the cavity; and illuminating a back of the semiconductor substrate to adjust a current density in etching the semiconductor materials, wherein the doping of the semiconductor material for an edge region and a central region of the porous diaphragm layer is selected so that mesopores are formed in the edge region and one of macropores or mesopores, having a higher porosity compared to the edge region, are formed in the central region.

* * * * *